(12) United States Patent
Sawhney

(10) Patent No.: US 6,567,332 B2
(45) Date of Patent: May 20, 2003

(54) MEMORY DEVICES WITH REDUCED POWER CONSUMPTION REFRESH CYCLES

(75) Inventor: Ramandeep S. Sawhney, Richardson, TX (US)

(73) Assignee: Micron Technology, Inc., Boise, ID (US)

( * ) Notice: Subject to any disclaimer, the term of this patent is extended or adjusted under 35 U.S.C. 154(b) by 61 days.

(21) Appl. No.: 09/808,900

(22) Filed: Mar. 15, 2001

(65) Prior Publication Data

US 2002/0133663 A1 Sep. 19, 2002

(51) Int. Cl.[7] .................................................. G11C 7/00
(52) U.S. Cl. ............... 365/222; 365/185.2; 365/185.25; 365/149; 365/230.09
(58) Field of Search .............................. 365/222, 185.2, 365/185.25, 149, 230.09

(56) References Cited

U.S. PATENT DOCUMENTS

| | | | |
|---|---|---|---|
| 4,631,701 A | 12/1986 | Kappeler et al. ............ 364/900 |
| 5,229,970 A | 7/1993 | Lee et al. .................... 365/222 |
| 5,262,998 A | 11/1993 | Mnich et al. ................ 365/222 |
| 5,276,843 A | 1/1994 | Tillinghast et al. ......... 395/425 |
| 5,278,796 A | 1/1994 | Tillinghast et al. ......... 365/211 |
| 5,323,350 A | 6/1994 | McLaury ..................... 365/208 |
| 5,335,201 A | 8/1994 | Walther et al. ............. 365/222 |
| 5,392,251 A | 2/1995 | Manning ..................... 365/222 |
| 5,539,703 A | 7/1996 | Manning ..................... 365/222 |
| 5,598,376 A | 1/1997 | Merritt et al. ......... 365/230.06 |
| 5,684,751 A | 11/1997 | Manning ..................... 365/222 |
| 5,717,654 A | 2/1998 | Manning ................. 365/233.5 |
| 5,835,433 A | 11/1998 | Casper ........................ 365/207 |
| 5,903,507 A | * 5/1999 | Arimoto ...................... 365/222 |
| 5,959,924 A | * 9/1999 | Son et al. .................... 365/222 |
| 5,999,471 A | * 12/1999 | Choi ........................... 365/222 |
| 6,094,705 A | 7/2000 | Song .......................... 711/106 |
| 6,097,658 A | 8/2000 | Satoh et al. ................. 365/222 |
| 6,208,577 B1 | 3/2001 | Mullarkey ................... 365/222 |
| 6,304,494 B1 | * 10/2001 | Arimoto ................. 365/189.09 |

* cited by examiner

Primary Examiner—David Nelms
Assistant Examiner—Connie C. Yoha
(74) Attorney, Agent, or Firm—Schwegman, Lundberg, Woessner & Kluth, P.A.

(57) ABSTRACT

Systems, devices, structures, and methods are described that reduce energy consumption during a refresh cycle in a memory device. An isolation signal is held in a non-energized state until the it is determined that another action is to be performed on the section of memory associated with the isolation signal. The isolation accordingly cycles from an energized state to a non-energized state and back for each complete refresh cycle in the section of memory.

85 Claims, 7 Drawing Sheets

MEMORY DEVICES WITH REDUCED POWER CONSUMPTION REFRESH CYCLES

FIELD OF THE INVENTION

The technical field relates generally to memory devices, and, more particularly, to memory devices having reduced power consumption refresh cycles.

BACKGROUND

Memory cells are commonly formed in integrated circuits by energy storage devices, such as capacitors. A capacitor is composed of two layers of a material that is electrically conductive (hereinafter, electrodes) brought near to one another and separated by a material that is electrically nonconductive. The capacitor is connected to an energy source (e.g. battery) with a certain voltage level (hereinafter, energy level). Charge flows from the energy source to the capacitor until the capacitor exhibits the energy level of the energy source. Then, the capacitor is disconnected from the energy source. The capacitor will exhibit the energy level of the energy source until the charges stored in the capacitor are removed either by design or unintentionally.

This ability of the capacitor to "remember" an energy level is valuable to the operation of semiconductor integrated circuits. Often, the operation of such circuits may require that data be stored and retrieved as desired. Because of its ability to remember, the capacitor is a major component of a semiconductor memory cell. One memory cell typically stores one bit of data. A system of memory cells is a semiconductor memory array where information can be randomly stored and retrieved from each memory cell. Such a system is also known as a random-access memory.

One type of random-access memory is dynamic random-access memory (DRAM). The charges stored in DRAM tend to unintentionally leak away over a short time. It is thus necessary to periodically refresh the charges stored in the DRAM. Even with the refresh burden, DRAM is a popular type of memory because it can occupy a very small space on a semiconductor surface. This is desirable because of the need to maximize storage capacity, i.e. the number of stored bits, on the limited surface area of an integrated circuit.

Examples of some refresh schemes are disclosed in U.S. Pat. No. 6,097,658 issued to Satoh et al.; U.S. Pat. No. 6,094,705 issued to Song; and U.S. Pat. No. 4,631,701 issued to Kappeler et al.; all incorporated herein by reference.

Many modem electronic devices are portable devices which use a battery as its energy source. As more and more portable electronic devices are developed and find commercial acceptance, it is desirable to conserve energy. Conservation of energy is driven by the need to use smaller and lighter power supplies so the electronic devices incorporating the power supply are themselves smaller and lighter. Moreover, there is a need to conserve energy so that the energy source lasts longer and the electronic device can operate longer between energy source charges or replacement. Accordingly, power consumption in memory devices used in electronic devices is becoming increasingly important.

SUMMARY

The above-mentioned problems with memory devices as well as other problems are addressed by the present invention and will be understood by reading and studying the following specification including the drawings attached hereto. Systems, devices, structures, and methods are described which provide benefits over conventional memory devices.

An illustrative embodiment includes a method for refreshing memory cells in a memory device, wherein the refresh operation uses less energy than conventional refresh operations.

Another illustrative embodiment includes a method of conserving energy while refreshing memory cells in a memory device. One embodiment of the invention includes holding the isolation signal in a non-energized state while refreshing memory cells in an adjacent section of the memory device. The isolation signal is held in the non-energized state under a certain conditions, including but not limited to, completion of the refresh cycle, receipt of a memory address in the memory section, and receipt of a redundancy signal.

Another illustrative embodiment includes a method of reducing energy consumption during a refresh operation in a memory device. The method includes shifting an LEQ signal from an energized state to a non-energized state. The method further includes shifting an isolation signal from an energized state to a non-energized state The method further includes sequentially energizing wordlines in the memory device to refresh the memory cells connected to the energized wordline, and holding the isolation signal in a non-energized state during energizing at least two wordlines.

Another illustrative embodiment includes a memory array, which must be refreshed to preserve the integrity of the data stored therein. The memory array includes at least one memory section having a plurality of wordlines each connected to at least one memory cell. The memory cells are further connected to digit lines which are connected to a sense amplifier through isolation gates. An isolation gate control circuit holds the isolation gate off during a refresh cycle of the memory section until an end event occurs. A nend event is an event in the memory array that indicates the refresh operation is to end. In various embodiments, the end event includes, but is not limited to, at least one of completion of a self refresh cycle, addressing a memory cell in the memory section for a read or write operation, a redundancy operation, or issuance of an end refresh signal by a control circuit.

Another illustrative embodiment includes a controller for a refresh operation in a memory device. The controller holds the isolation signal at a non-energized state until an end refresh event occurs.

Other illustrative embodiments include a DRAM, a circuit module, a memory module, an electronic system, a memory system, or a computer system, which include the memory refresh structure according to the present invention or performs a memory refresh according to method of the present invention.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

DETAILED DESCRIPTION

In the following detailed description of various embodiments of the present invention, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined by the appended claims and their equivalents.

Figure 1:
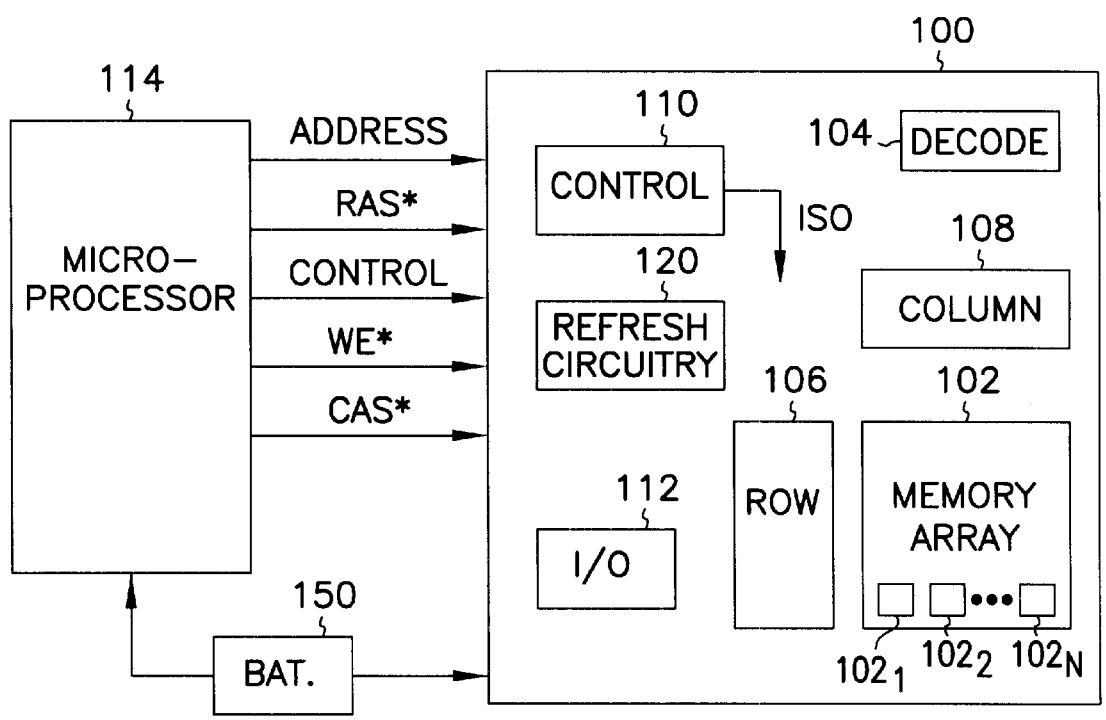
FIG. 1 is a block diagram of a device having a memory array.

FIG. 1 is a simplified block diagram of a memory device according to one embodiment of the invention. A memory device 100, e.g. DRAM, includes an array of memory cells 102, address decoder 104, row decoder 106, column decoder 108, control circuitry 110, and Input/Output circuit 112. The memory device can be coupled to an external microprocessor 114, or memory controller for memory accessing functions, or other external circuitry. Memory device 100 receives control signals from the processor 114, such as WE*, RAS*, and CAS* signals. The control circuitry 110 produces an ISO signal as understood by those of skill in the art. In one embodiment, ISO signal in an energized ("on") state is powered to 1.5 times Vcc, which is typically expressed as Vccp. The memory device 100 and processor 114 are both powered by an energy source, and in the case of portable electronic devices, the energy source is a battery 150. The battery may be of a rechargeable type (e.g. Li Ion, alkaline) or non-rechargeable type. The memory device is used to store data which is accessed via I/O lines. Memory device 100 has at least one memory array 102, and may include a plurality of arrays to increase the memory storage capacity. Memory array 102 may be divided into a plurality of sub-arrays or sections $102_1, 102_2, \ldots 102_N$. A refresh circuit 120 is provided to refresh the charge in the individual cells (e.g. capacitors or transistors) which form the memory array 102. In the case of DRAMs, the charge in the cell dissipates in a matter of milliseconds. Hence, the data bit stored in each of the memory cells must be re-read and recharged many times per second in order to hold its data.

Figure 4:
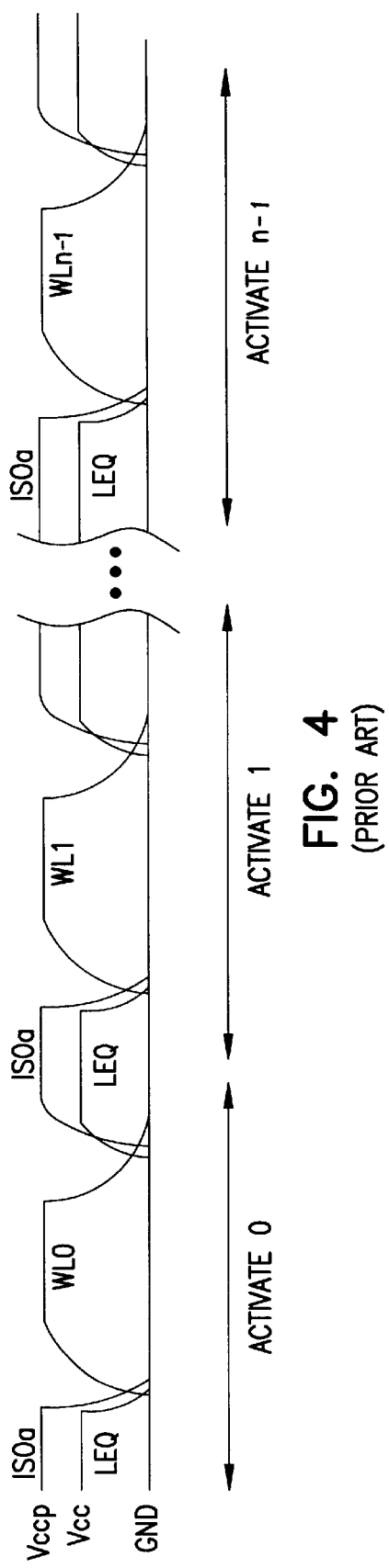
FIG. 4 is a timing diagram of a conventional memory refresh operation.
Figure 5:
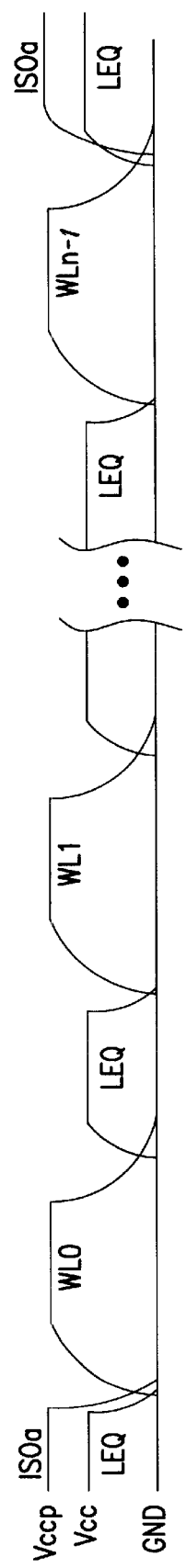
FIG. 5 is a timing diagram of a memory refresh operation of a memory device according to one embodiment of the present invention.

The process used to restore the charge in DRAM memory cells at specified intervals is generally referred to as a refresh operation. The required refresh interval is a function of the memory cell design and the semiconductor technology used to manufacture the memory device. There are several conventional refresh schemes that may be used. A conventional scheme is shown in FIG. 4. A scheme according to the present invention is shown in FIG. 5. Both of these schemes are discussed below.

Figure 2:
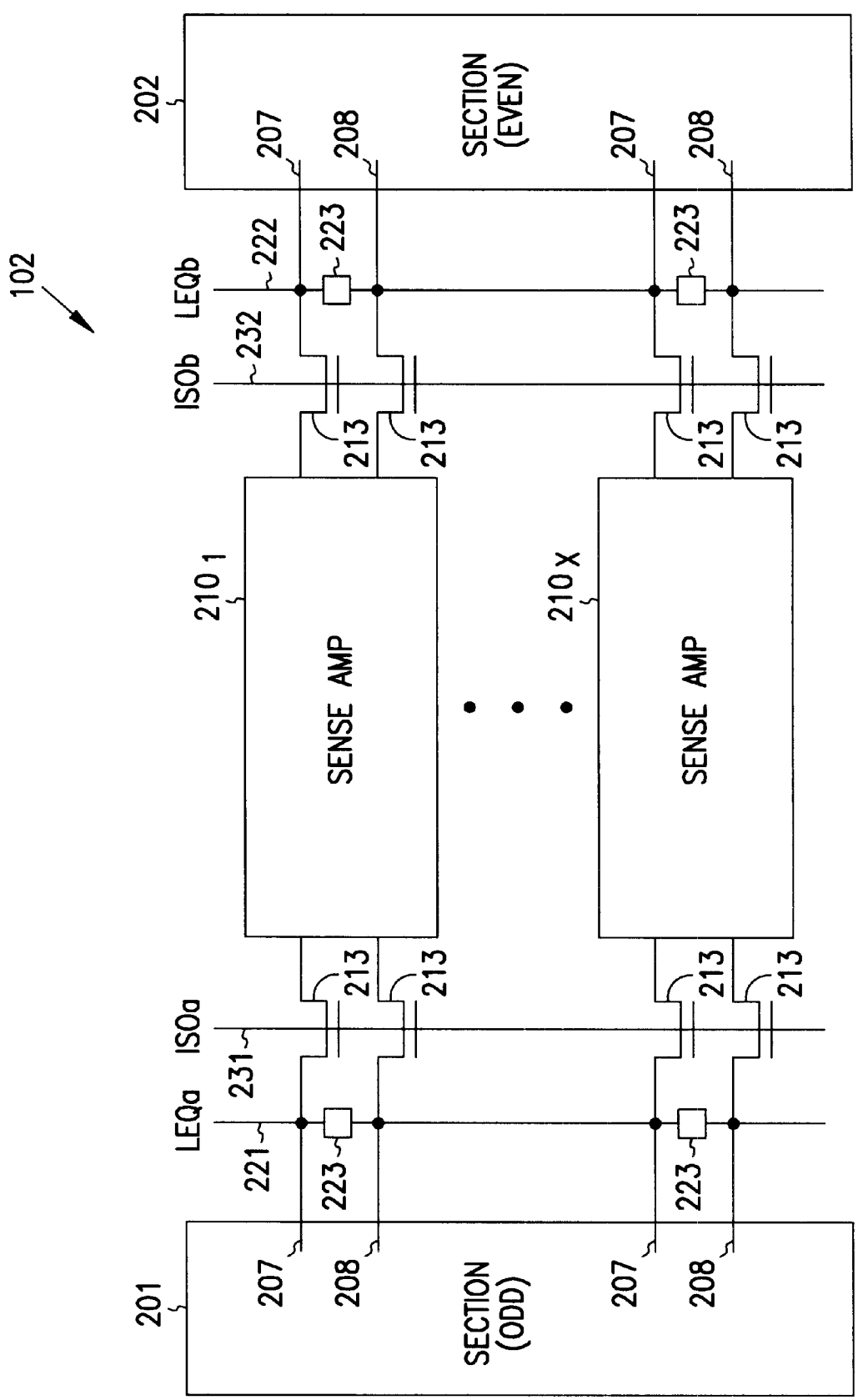
FIG. 2 is a block diagram of a memory system according to one embodiment of the present invention.

FIG. 2 schematically shows a memory array 102, which includes a first memory section (sub-array) 201 and a second memory section (sub-array) 202, according to the present invention. The first and second sub-arrays 201 and 202 are respectively labeled as an odd section and an even section in FIG. 2. Each memory section includes numerous memory cells (not shown) which store a charge representing one data bit. Each cell is addressable by column and wordline as the same is known and understood by one of ordinary skill in the art. The memory sections 201, 202 each include a plurality of wordlines, for example, 128, 256, 512, or more addressable wordlines. The size of the memory, i.e. the number of wordlines, depends on the architecture of the memory array 102 and memory device 100. It is usually desired to have a greater number of wordlines in each section which results in a large memory capacity in each memory array. As shown in FIG. 2, a number of pairs of digit lines 207, 208 (DIG and DIG*) are connected to respective memory cells in each of the memory sections 201 and 202. The pairs of digit lines 207, 208 from each of the memory sections 201 and 202 are connected to one or more sense amplifiers $210_1$–$210_X$, where X is the number of sense amplifiers. It will be recognized by those of skill in the art that the sense amplifiers $210_1$–$210_X$ operate to determine the change in charge on the digit lines 207, 208 and fully drive the digit lines to the charge stored in the memory cells selectively connected thereto. A brief description of the sense amplifier operation is described in U.S. Pat. No. 5,835,433 issued to Casper, assigned to the assignee of the present application, and incorporated herein by reference.

FIG. 2 further shows a pair of equilibration lines 221 and 222. Equilibration line 221 is connected to equilibration circuits 223, which are connected to pairs of digit lines 207, 208 connected to memory section 201. Equilibration line 222 is connected to equilibration circuits 223, which are connected to pairs of digit lines 207, 208 connected to memory section 202. Equilibration lines 221, 222 are respectively connected to equilibration drivers (not shown) that are controlled by control 110. Equilibration drivers produce LEQ signals in response to control signals from control 110. In another embodiment, equilibration lines 221, 222 are connected to a single driver (not shown) that generates at least one equilibration signal. That is, the equilibration lines 221, 222 may carry a same signal. The number of equilibration circuits 223 is equal to half the number of digit lines 207, 208. Equilibration circuits 223, when activated by a driver, are used to equilibrate the voltage of digit lines 207, 208 between read and write operations. Typically, the voltages on the digit lines are equilibrated to Vcc÷2. The operation of the equilibration circuits 223 is known and understood by one of ordinary skill in the art. As shown in FIG. 2, LEQa signal is connected with the digit lines connected to the odd memory section 201 and is communicated through line 221. LEQb signal is connected with digit lines connected to the even memory section 202 and is communicated through line 222.

Each digit line 207 and 208 includes an isolation switch (sometimes referred to as a "gate") 213, which is shown as a transistor (MOSFET) having the gate thereof connected to an isolation signal line 231, 232. Isolation signal line 231 is associated with the odd memory section 201 and carries the ISOa signal. When the ISOa signal goes low, switches 213 electrically isolate odd memory section 201 from the sense amplifiers 210. Isolation signal line 232 is associated with the even memory section 201 and carries the ISOb signal. When the ISOb signal goes low, switches 213 electrically isolate even memory section 202 from the sense amplifiers 210.

Figure 3:
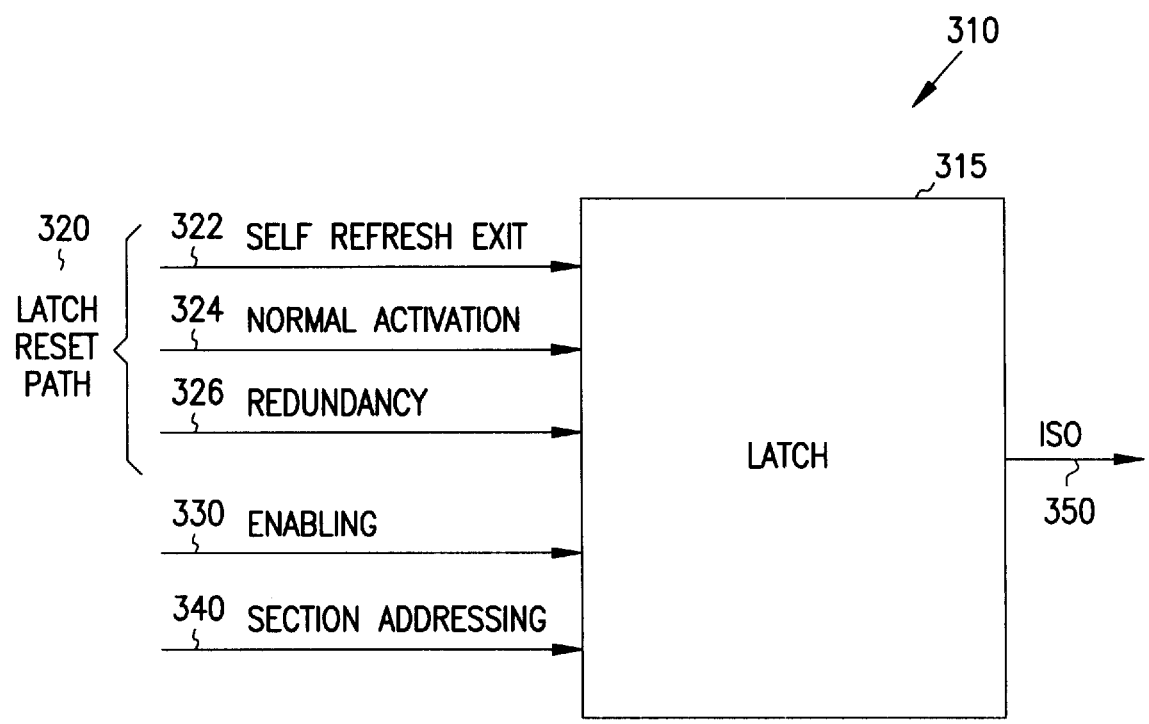
FIG. 3 is a diagram of an isolation signal generation circuit according to one embodiment of the present invention.

FIG. 3 illustrates an ISO control circuit 310 according to the teachings of the present invention. Circuit 310 includes a latch 315, which receives a plurality of inputs 320, 330, or 340 and creates as an output 350 the ISO signal. One ISO control circuit 310 is connected to each of the ISO signal lines 231, 232 in the memory array 102 for producing ISOa, ISOb signals, respectively. ISO control circuit 310 may be incorporated into an ISO signal driver as the same will be known and understood by one of ordinary skill in the art. While two ISO signals and signal lines are shown and described, it will be understood that other numbers of ISO signals and lines may also be used.

Latch 315 receives inputs signals through a number of input lines, shown in FIG. 3 as a latch reset path signal 320, an enable signal 330, and an address signal 340, which are generated by control circuits (not shown). The latch reset path signal 320 is an "off" (e.g. high or low depending on circuit layout) signal until an operation is to be performed on the memory section connected to the same ISO signal line as circuit 310. For example, the latch reset path signal 320 shifts to "on" (high) when a refresh cycle is stopped in the associated memory section. Upon receiving an "on" latch rest signal, latch 315 shifts the ISO signal high and activates gates 213 to connect digit lines 207, 208 to sense amplifiers 210. The ISO signal returns to conventional operation associated with non-refresh functions of the memory section.

In one embodiment, reset path signal 320 includes a self refresh exit signal 322, a normal activation signal 324, and a redundancy signal 326. Each of signals 322, 324, and 326 represent a signal for ending holding the ISO signal in its un-energized or low energy state. Signals 322 and 324 represent one type of end refresh event. Self refresh exit signal 322 represents the completion of a self-refresh operation, e.g. all memory cells have been refreshed, user issues an exit command or any other basis for ending a self refresh operation for the memory section associated with the output ISO signal from the circuit 310. Normal activation signal 324 represents activating the memory section for a read or write operation. Redundancy signal 326 represents a jump in the sequential addressing in a memory section to another memory section for any reason. That is, the refresh operation of this memory section ends due to the sequential memory address progressing to another section.

The enable signal 330 is "off" for a refresh cycle. The enable signal 330 being in an "on" state is another end refresh event. The "on" enable signal 330 indicates, in one embodiment, that control circuits (not shown) have turned this memory array 102 "on" for a write or read operation. One example of enable signal 330 is WE*. Another example of an enable signal 330 is a signal produced by address transient detector, which detects a change in an address signal in the memory device as understood by one of ordinary skill in the art.

The section address signal 340 is also "off" for a refresh cycle. The section address signal 340 being in the "on" state is another end refresh event. The "on" address signal indicates, in one embodiment, that a section address for controlling access in a memory section has been generated by addressing circuitry (e.g. processor 114 or memory controller) and appropriate addresses are sent to respective decode circuits, e.g. decoder 104, row decoder 106, column decoder 108. Thus, the section address signal 340 is "off" when no section address signal is generated for an address of a memory cell in a particular section, such as during a refresh cycle.

Accordingly, the latch produces a low output ISO signal, when the latch reset path signal 320 is "off" and the enable signal 330 and the address signal 340 are "off". The low ISO signal communicates through the ISO signal line, e.g. lines 231 or 232, to control operation of isolation gates 213. Latch 315 holds the state of the output ISO signal until one of the rest path signal 320, the enable signal 330 or the address signal 340 shift to the "on" state. Once a refresh operation begins circuit 310 holds the ISO signal an unpowered or low energy ("off") state. This state is maintained until an end refresh event occurs and a signal 320, 330, or 340 is input into circuit 310. Once this happens, the ISO signal is re-energized and returns to normal operation involved in isolating and connecting memory sections to the sense amplifiers through digit lines. This saves power by not re-energizing the ISO signal on line 231 or 232 and the associated isolation gates 213 during a refresh operation. Once in a refresh operation, the memory device 102 assumes it stays in a refresh mode for a particular section until an end refresh event occurs.

In another embodiment of the present invention, the enable signal 330 is used to control activation of the refresh control circuit 310. The refresh control circuit has a inactive state and an active state. In the inactive state, the refresh control circuit 310 is disabled and the associated memory section is not in a refresh operation. The ISO signal operates is a conventional manner to allow access to the data stored in the memory section. In the active state of the refresh control circuit 310, the associated memory section is undergoing a refresh operation. Refresh control circuit 310 is enabled to hold the ISO signal in a de-energized state until an end refresh event occurs.

Some memory devices must be refreshed in order to preserve the integrity of the stored data. In the case of DRAM, the refresh must occur several times each second. FIG. 4 illustrates a timing diagram of a conventional refresh operation for refreshing memory cells in a memory array. The LEQ signal shifts "low" (unpowered or grounded) to turn off the equilibration circuits. This electrically disconnects the pair of digit lines from the equilibration circuit connected therebetween. Accordingly, the equilibration circuits will not interfere with refreshing the memory cells. At about the same time as the LEQ signal shifts "low", the isolation signal is also shifted "low" (unpowered or grounded) in order to electrically disconnect (open) the sense amplifiers from the memory section. Then the first of the wordlines $WL_0$ is energized to refresh the memory cells connected thereto as the same will be understood by one of ordinary skill in the art. After a certain length of time, depending on the refresh requirements of the memory cells connected to the wordline and the clock signal, the wordline is de-energized (grounded) and both the LEQ and ISO signals are energized. This process repeats n times, once for each of n wordlines, $WL_0$ to $WL_{n-1}$, in the memory section. In a conventional refresh operation, the ISO signal is re-energized n times during a refresh operation in a memory array having n wordlines. For further illustration of the energy consumption during a conventional refresh operation, assume that a single memory section to which is applied the above conventional refresh operation has 512 wordlines, then the ISO signal is re-energized 512 times during a refresh cycle. This is also occurs for each additional memory section. Thus, if the memory has two such memory sections, then wordlines are re-energized 1,024 (512 * 2). If the memory has N such memory sections, then wordlines are re-energized N * 512 times.

In another example, a memory device having 256 Meg's of memory is typically divided into four equal banks of 64 Meg's. Each bank includes 32 sections of 2 Meg's each. Each section has 512 wordlines. Thus, each bank has 16 k wordlines, for a total of 64 k wordlines. One type of refresh operation is an 8 k refresh, which simultaneously refreshes two wordlines, one in one section and one in another section, in each of the four memory banks. That is, eight wordlines are simultaneously energized. In this type of refresh, the ISO signals will turn on 8,192 times and off 8,192 times {(2 ISO's * 8 simultaneous wordlines) * 512 [section size]} per bank, in which two wordlines are energized at a time. Thus, conventional refresh schemes use a significant amount of energy, which is a premium in portable electronic devices powered by portable energy sources, e.g. batteries, to insure the integrity of the data stored in memory.

FIG. 5 shows a timing diagram of a refresh operation according to the present invention. The LEQ and ISO signals begin in an energized ("on") state. The LEQ and ISO signals are non-energized ("low" or grounded) and the first wordline $WL_0$ is energized to refresh the memory cells connected to it. After a time period sufficient to energize the memory cells having an energized or "on" state, the wordline $WL_0$ is deenergized (grounded). At about the same time as wordline $WL_0$ is grounded, LEQ is energized ("high" or Vcc). A counter in refresh circuit 120 increases by one to track which is the next wordline in the refresh cycle. Unlike the conventional refresh schemes, the circuit 310 holds ISO signal at its low state as explained in detail with regard to FIG. 3. Accordingly, energy is not drawn from the power source 150 (battery in portable devices) to re-energize the ISO signal. When refreshing the memory cells connected to the next wordline $WL_1$, only the LEQ signal is de-energized (grounded) because the ISO signal remains at the de-energized (grounded) state. This continues for each of n wordlines $WL_0$–$WL_{n-1}$. The counter updates its count after each wordline is energized. After the last wordline $WL_{n-1}$ is refreshed, then the ISO signal is re-energized (high or Vccp) again controlled by circuit 310.

As FIGS. 4 and 5 show, the ISO signal and wordlines $WL_0$–$WL_{n-1}$ are energized to a Vccp level. The LEQ signal is energized to a Vcc level. The Vccp is higher than Vcc. Thus, the energy saved according to the teachings of the present invention are based on a greater voltage level than the external voltage level Vcc. This results in greater power savings as the transition between ground and Vccp is greater than the transition between ground and Vcc. Therefore, it is important to reduce the number of re-energization of any signal to the Vccp level to conserve power.

FIG. 2 shows that two memory sections 201 and 202. In one embodiment of the invention, at least one memory section is refreshed at a time. Memory section 202 is active and a read or write function is being performed. At the same time, memory section 201 is non-active and is not performing a read or write function. Odd memory section 201, at select times typically determined by memory controller 110, is subject to a refresh operation. The refresh of memory section 201 begins when appropriate latch reset path signal 320, enabling signal 330, and address signal 340 are received in latch 315. Based on these signals latch 315 will de-energize ISOa signal transmitted through line 231. LEQa signal traveling through line 221 to equilibration circuits 223 is de-energized. The first wordline $WL_0$ of memory section 201 is energized and the memory cells connected to wordline $WL_0$ are refreshed. Wordline $WL_0$ is de-energized and LEQa is energized. ISOa remains de-energized. The process, LEQa de-energization, wordline energization, wordline de-energization, LEQ energization, repeats itself for each wordline in memory section 201 until a refresh ending event occurs, which arrives as at least one of signals 320, 330, or 340 at latch 315. The refresh end events include refreshing the last wordline $WL_{n-1}$ in memory section 201, a normal activation of the ISOa signal, a skip in memory sequence to a different memory section (redundancy), and an access operation addressing the memory section 201. After a refresh end event occurs, the refresh operation on memory section 201 ends and ISOa is re-energized.

In another embodiment, two adjacent memory sections 201 and 202 could simultaneously undergo refresh operations. Foe example, in a configuration where the memory sections have separate sense amplifiers. That is, the sense amplifier banks of FIG. 2 each include separate sense amplifiers for each of the memory sections 201 and 202. The refresh operation on each of the memory sections is the same as the operation described above for each of the memory sections.

The refresh operation according to the invention does not require re-energization of the ISO signal in a section of memory undergoing a refresh operation after each wordline is energized and de-energized. The refresh operation automatically sequentially progresses ($WL_0$, $WL_1$, $WL_2$, . . . $WL_{n-1}$) through a section of memory (e.g. 201) to refresh the memory cells therein while the ISO signal remains de-energized. The next location and operation in this section of memory is known and there is no need to reenergize the ISO signal. The present invention uses signals present in the memory device to re-energize the ISO signal when it is required to end the refresh cycle. More specifically, the latch reset path 320 senses when a refresh operation in a section is ended and the ISO latch circuit 315 re-energizes the ISO signal. The enabling signal 330 and the addressing signal 340 are also input into the ISO latch circuit 315 and based on these inputs, latch circuit 315 may re-energize the ISO signal.

The refresh operation according to the present invention is applicable to a memory section having a section size of any number of wordlines (e.g.64, 128, 256, 512, or greater). Even with any number of wordlines in a memory section, the ISO signal is re-energized only once at the end of a refresh operation for the memory section. When compared to the above conventional refresh of a memory section having 512 wordlines, the present invention reduces energy consumption at about a ratio of 1:512 per section (sub-array). In a memory device having 256 Meg of memory with four banks of 32 sections and an 8 k refresh, the ISO signals will turn on 16 times and off 16 times {2 ISO's * 8 simultaneous wordlines) * 1 [section=any size]}. This represents a significant energy savings, especially in portable electronic devices.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art. A brief description of various embodiments of structures, devices and systems in which the present invention may be incorporated follows. It will be recognized that the following are exemplary and are not exclusive of other structures, devices, and systems in which the memory device according to present invention may be used.

Semiconductor Dies

Figure 6:
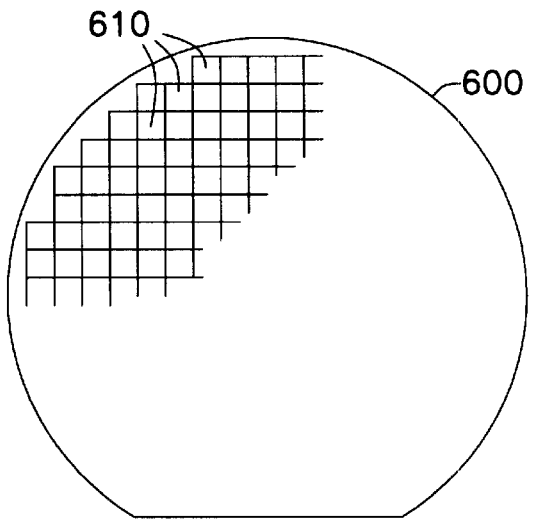
FIG. 6 is a view of a wafer containing semiconductor dies.

With reference to FIG. 6, for one embodiment, a semiconductor die 610 is produced from a wafer 600. A die is an individual pattern, typically rectangular, on a substrate that contains circuitry, or integrated circuit devices, to perform a specific function. At least one of the integrated circuit devices contains a memory with a refresh circuit in accordance with the present description. A semiconductor wafer will typically contain a repeated pattern of such dies containing the same functionality. Die 610 may contain circuitry for the memory device as discussed herein. Die 610 may further contain additional circuitry to extend to such complex devices as a monolithic processor with multiple functionalities. Die 610 is typically packaged in a protective casing (not shown) with leads extending therefrom (not shown) providing access to the circuitry of the die for unilateral or bilateral communication and control.

Circuit Modules

Figure 7:
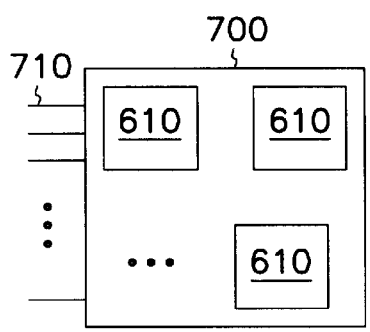
FIG. 7 is a block diagram of a circuit module.

As shown in FIG. 7, two or more dies 610 may be combined, with or without protective casing, into a circuit module 700 to enhance or extend the functionality of an individual die 610. Circuit module 700 may be a combination of dies 610 representing a variety of functions, or a combination of dies 610 containing the same functionality. One or more dies 610 of circuit module 700 contain at least one memory capable of a refresh operation as described herein.

Some examples of a circuit module include memory modules, device drivers, power modules, communication modems, processor modules and application-specific modules, and may include multilayer, multichip modules. Circuit module 700 may be a subcomponent of a variety of electronic systems, such as a clock, a television, a cell phone, a personal computer, an automobile, an industrial control system, an aircraft and others. Circuit module 700 will have a variety of leads 710 extending therefrom and coupled to the dies 610 providing unilateral or bilateral communication and control.

Figure 8:
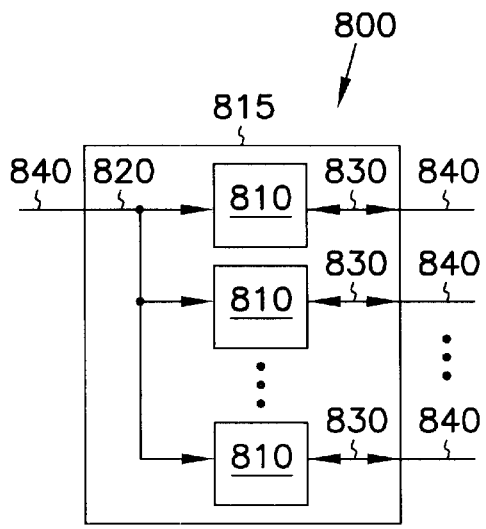
FIG. 8 is a block diagram of a memory module.

FIG. 8 shows one embodiment of a circuit module as memory module 800. Memory module 800 contains multiple memory devices 810 contained on support 815, the number generally depending upon the desired bus width and the desire for parity. Memory devices 810 include at least one memory capable of a refresh operation as described herein. Memory module 800 accepts a command signal from an external controller (not shown) on a command link 820 and provides for data input and data output on data links 830. The command link 820 and data links 830 are connected to leads 840 extending from the support 815. Leads 840 are shown for conceptual purposes and are not limited to the positions shown in FIG. 8.

Electronic Systems

Figure 9:
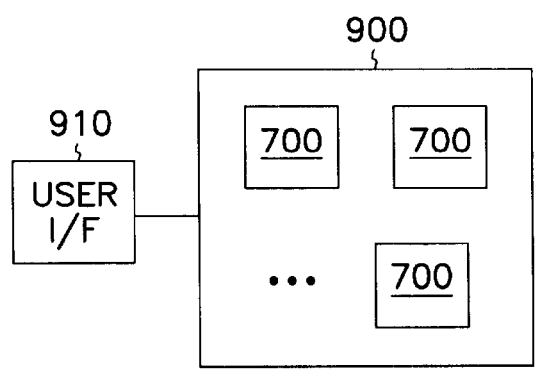
FIG. 9 is a block diagram of an electronic system.

FIG. 9 shows one embodiment of an electronic system 900 containing one or more circuit modules 700, at least one of which includes a memory device capable of a refresh operation as described herein. Electronic system 900 generally contains a user interface 910. User interface 910 provides a user of the electronic system 900 with some form of control or observation of the results of the electronic system 900. Some examples of user interface 910 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 910 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 910, or of other information either preprogrammed into, or otherwise provided to, electronic system 900. As will be apparent from the lists of examples previously given, electronic system 900 will often be associated with certain mechanical components (not shown) in addition to circuit modules 700 and user interface 910. It will be appreciated that the one or more circuit modules 700 in electronic system 900 can be replaced by a single integrated circuit. Furthermore, electronic system 900 may be a subcomponent of a larger electronic system.

Figure 10:
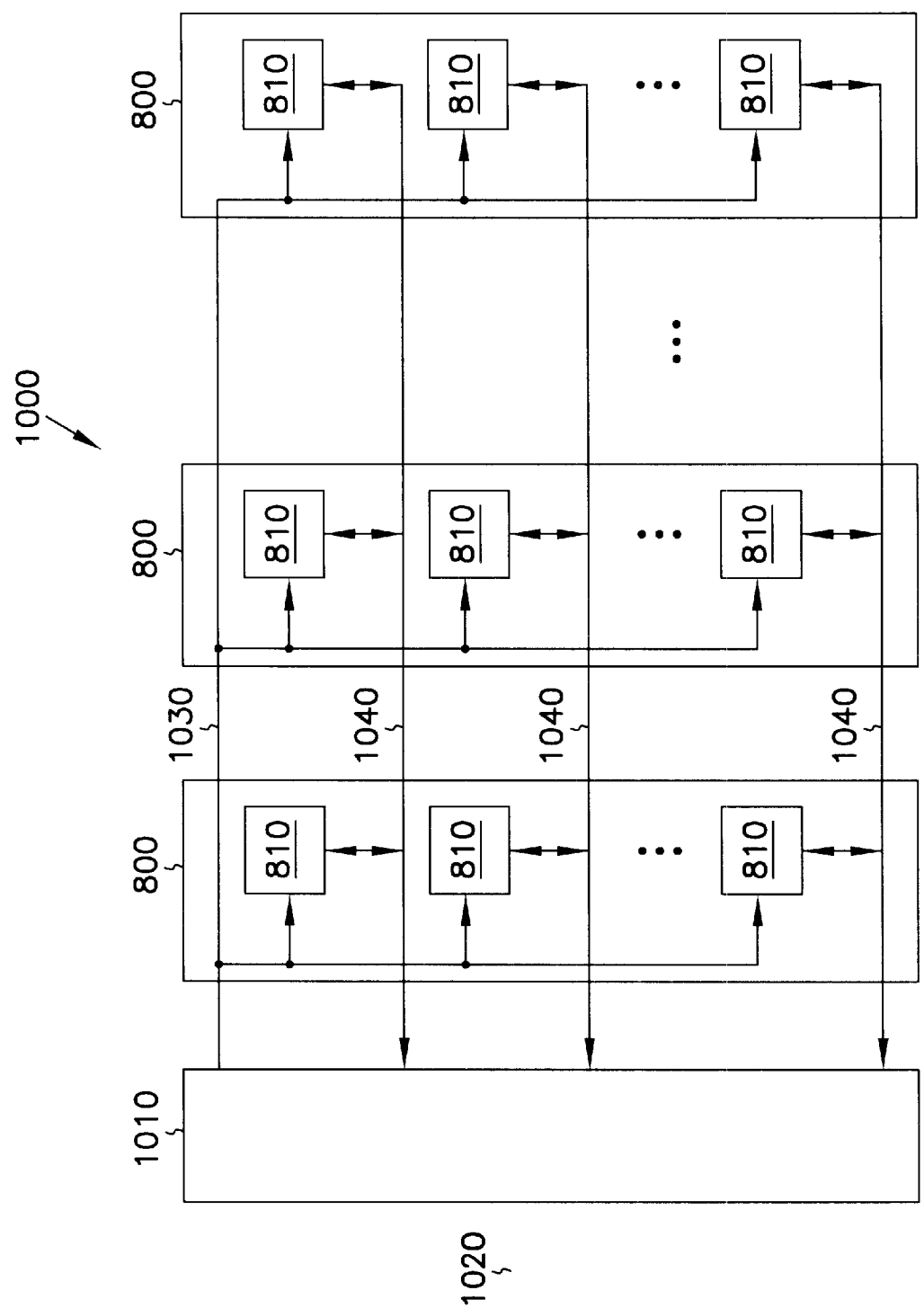
FIG. 10 is a block diagram of a memory system.

FIG. 10 shows one embodiment of an electronic system as memory system 1000. Memory system 1000 contains one or more memory modules 800 and a memory controller 1010. At least one of the memory modules is capable of a refresh operation as described herein. Memory controller 1010 provides and controls a bidirectional interface between memory system 1000 and an external system bus 1020. Memory system 1000 accepts a command signal from the external bus 1020 and relays it to the one or more memory modules 800 on a command link 1030. Memory system 1000 provides for data input and data output between the one or more memory modules 800 and external system bus 1020 on data links 1040.

Figure 11:
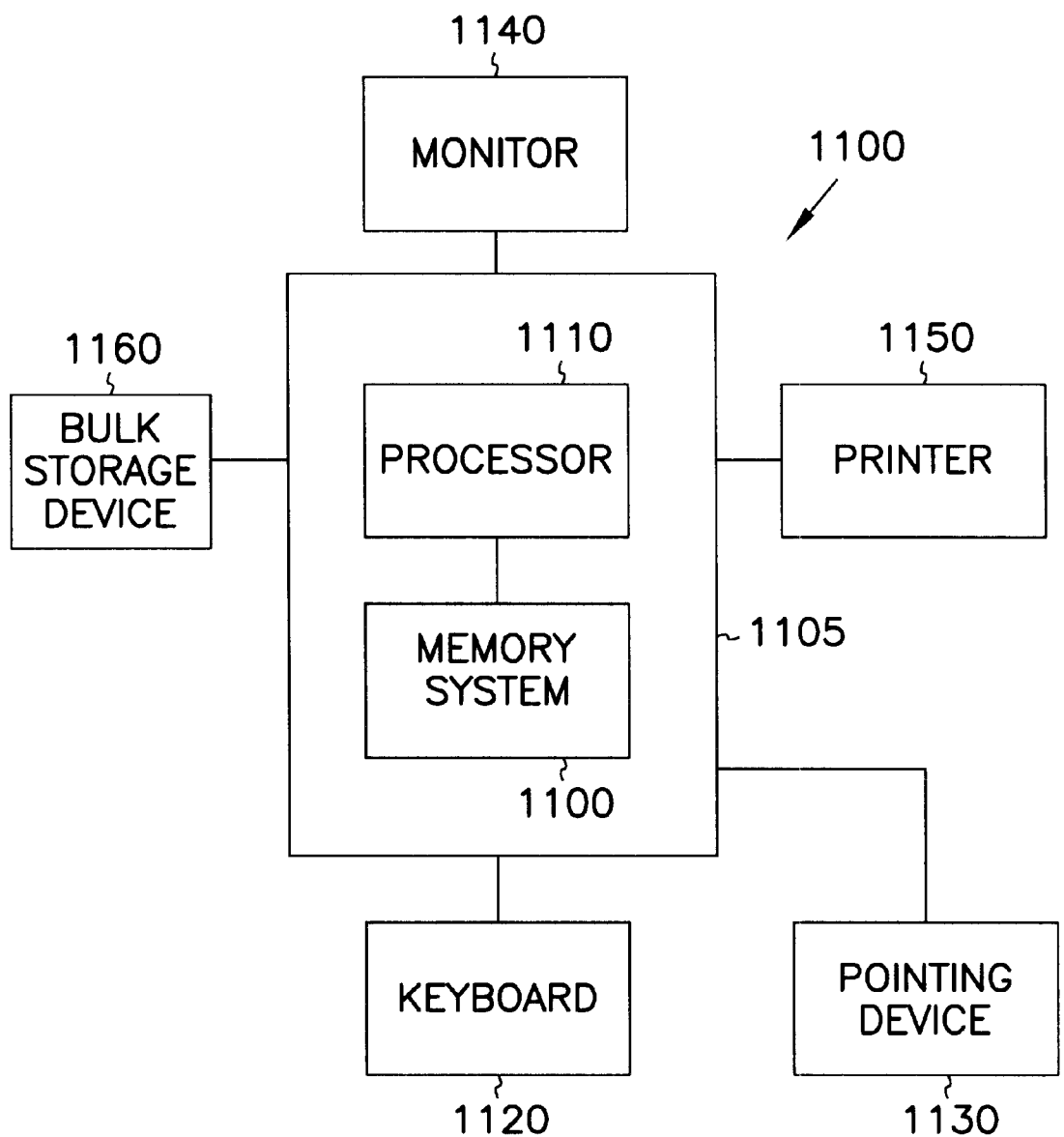
FIG. 11 is a block diagram of a computer system.

FIG. 11 shows a further embodiment of an electronic system as a computer system 1100. Computer system 1100 contains a processor 1110 and a memory system 1000 housed in a computer unit 1105. Computer system 1100 is but one example of an electronic system containing another electronic system, i.e., memory system 1000, as a subcomponent. The memory system includes at least one memory device that is capable of a refresh operation as described herein. Computer system 1100 optionally contains user interface components. Depicted in FIG. 11 are a keyboard 1120, a pointing device 1130, a monitor 1140, a printer 1150 and a bulk storage device 1160. It will be appreciated that other components are often associated with computer system 1100 such as modems, device driver cards, additional storage devices, etc. It will further be appreciated that the processor 1110 and memory system 1000 of computer system 1100 can be incorporated on a single integrated circuit. Such single package processing units reduce the communication time between the processor and the memory circuit.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit which requires a refresh cycle and includes similar architecture as described herein.

It will be further understood that while the above description describes signals as being "on" when in the "high" or "powered" state, it is within the scope of the present invention to provide other signal states for "on". One example is a low-active signal, for example like RAS*. Suitable changes to the circuitry described herein would allow the present invention to be practiced with low or high active signals without departing from the scope of the present invention.

Conclusion

The present invention reduces the power consumed by a memory device in re-energizing the isolation signal during every cycle in a refresh operation. The isolation signal must be energized after each wordline is refreshed in conventional control schemes as it is not known whether a wordline in an associated memory array section will be addressed or not. In the present invention, the isolation signal control circuit holds isolation signal in an off state until an end event occurs while the refresh operation progresses though the memory array section. According to the teachings of the present invention the end events include, but is not limited to, reaching the end of the memory array section, receiving a self refresh exit signal, activating memory section access, and issuing a redundancy command. That is, the present invention is programmed to perform a refresh operation as the next operation in a memory section undergoing memory refresh until the refresh control circuit receives a command signal stopping the refresh operation. Thereafter, the refresh control circuit shifts the isolation signal to an energized state.

Although the specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

I claim:

1. A method of reducing energy consumption during a refresh operation in a memory device, comprising:
    shifting an LEQ signal from an energized state to a non-energized state;
    shifting an isolation signal from an energized state to a non-energized state;
    sequentially energizing wordlines in the memory device to refresh memory cells connected to the energized wordline; and
    holding the isolation signal in a non-energized state during energizing at least two wordlines.

2. The method according to claim 1, wherein sequentially energizing wordlines includes energizing N wordlines.

3. The method according to claim 1, wherein shifting the LEQ includes shifting the LEQ signal from the non-energized state to the energized state between energizing successive wordlines.

4. The method according to claim 3, wherein holding the isolation signal includes re-energizing the isolation signal after energizing the last wordline.

5. A method of reducing energy consumption during a refresh operation in a memory device, comprising:
    shifting an isolation signal from an energized state to a non-energized state;
    sequentially energizing wordlines in the memory device to refresh memory cells connected to the energized wordline;
    sequentially equalizing pairs of digit lines in the memory device; and
    holding the isolation signal in a non-energized state during sequentially energizing wordlines and until an end event occurs.

6. The method according to claim 5, wherein holding the isolation signal in a non-energized state includes re-energizing the isolation signal when a self-refresh exit signal is generated.

7. The method according to claim 5, wherein holding the isolation signal in a non-energized state includes re-energizing the isolation signal when an address signal indicates that at least one of the memory cells in the memory device is to be accessed.

8. The method according to claim 7, wherein re-energizing the isolation signal when an address signal indicates that at least one of the memory cells in the memory device is to be accessed includes reading data from the at least one memory cell.

9. The method according to claim 7, wherein re-energizing the isolation signal when an address signal indicates that at least one of the memory cells in the memory device is to be accessed includes writing data to the at least one memory cell.

10. The method according to claim 5, wherein holding the isolation signal in a non-energized state includes re-energizing the isolation signal when a redundancy signal indicates that a memory address sequence in the memory device jumps to a memory address of another memory array.

11. The method according to claim 5, wherein holding the isolation signal in a non-energized state includes re-energizing the isolation signal when all of the wordlines in the memory device have been energized.

12. A method of reducing energy consumption during a refresh operation in a DRAM, comprising:
    shifting an isolation signal from an energized state to a non-energized state;
    sequentially energizing wordlines in the DRAM to refresh the memory cells connected to the energized wordline;
    sequentially equalizing pairs of digit lines in the DRAM; and
    holding the isolation signal in a non-energized state during sequentially energizing wordlines and until an end event occurs.

13. The method according to claim 12, wherein holding the isolation signal in a non-energized state includes re-energizing the isolation signal when a self-refresh exit signal is generated.

14. The method according to claim 12, wherein holding the isolation signal in a non-energized state includes re-energizing the isolation signal when an address signal indicates that at least one of the memory cells in the DRAM is to be accessed.

15. The method according to claim 14, wherein re-energizing the isolation signal when an address signal indicates that at least one of the memory cells in the DRAM is to be accessed includes reading data from the at least one memory cell.

16. The method according to claim 14, wherein re-energizing the isolation signal when an address signal indicates that at least one of the memory cells in the DRAM is to be accessed includes writing data to the at least one memory cell.

17. The method according to claim 12, wherein holding the isolation signal in a non-energized state includes re-energizing the isolation signal when a redundancy signal indicates that a memory addressing sequence in the DRAM jumps to another memory array.

18. The method according to claim 12, wherein holding the isolation signal in a non-energized state includes re-energizing the isolation signal when all of the wordlines in the memory device have been energized.

19. A method of refreshing memory in a memory module, comprising:

selecting at least one of a plurality of memory arrays in the memory module on which to perform a refresh operation;

shifting an isolation signal from an energized state to a non-energized state in the at least one memory array;

equalizing a pair of digit lines in the at least one memory array; sequentially energizing wordlines in the at least one memory array to refresh memory cells connected to the energized wordline; and holding the isolation signal in a non-energized state during sequentially energizing wordlines and until an end event occurs.

20. The method according to claim 19, wherein holding the isolation signal in a non-energized state includes re-energizing the isolation signal when a self-refresh exit signal is generated.

21. The method according to claim 19, wherein holding the isolation signal in a non-energized state includes re-energizing the isolation signal when an address signal indicates that at least one of the memory cells in the memory device is to be accessed.

22. The method according to claim 21, wherein re-energizing the isolation signal when an address signal indicates that at least one of the memory cells in the memory array is to be accessed includes reading data from the at least one memory cell.

23. The method according to claim 21, wherein re-energizing the isolation signal when an address signal indicates that at least one of the memory cells in the memory array is to be accessed includes writing data to the at least one memory cell.

24. The method according to claim 19, wherein holding the isolation signal in a non-energized state includes re-energizing the isolation signal when a redundancy signal indicates that a sequence in memory addressing jumps to another memory array.

25. The method according to claim 19, wherein holding the isolation signal in a non-energized state includes re-energizing the isolation signal when all of the wordlines in the memory array have been energized.

26. A method of reducing energy consumption during a memory refresh operation in a computer system, comprising:

producing a refresh enable signal in the computer system indicating a refresh operation in at least one memory array;

shifting an isolation signal from an energized state to a non-energized state in the at least one memory array;

sequentially equalizing digit line pairs in the at least one memory array;

sequentially energizing wordlines in the at least one memory array to refresh memory cells connected to the energized wordline; and holding the isolation signal in a non-energized state during sequentially energizing wordlines and until an end event occurs.

27. The method according to claim 26, wherein producing a refresh enable signal includes timing the refresh operation with a system clock.

28. The method according to claim 27, wherein timing the refresh operation includes performing the refresh operation several times per second.

29. The method according to claim 26, wherein holding the isolation signal in a non-energized state during sequentially energizing wordlines includes re-energizing the isolation signal when a processor in the computer system issues an isolation re-energization signal.

30. The method according to claim 26, wherein holding the isolation signal in a non-energized state includes re-energizing the isolation signal when a self-refresh exit signal is generated.

31. The method according to claim 26, wherein holding the isolation signal in a non-energized state includes re-energizing the isolation signal when an address signal indicates that at least one of the memory cells in the memory array is to be accessed.

32. The method according to claim 31, wherein re-energizing the isolation signal when an address signal indicates that at least one of the memory cells in the memory array is to be accessed includes reading data from the at least one memory cell.

33. The method according to claim 31, wherein re-energizing the isolation signal when an address signal indicates that at least one of the memory cells in the memory array is to be accessed includes writing data to the at least one memory cell.

34. The method according to claim 26, wherein holding the isolation signal in a non-energized state includes re-energizing the isolation signal when a redundancy signal indicates that a memory addressing sequence jumps to another memory array.

35. The method according to claim 26, wherein holding the isolation signal in a non-energized state includes re-energizing the isolation signal when all of the wordlines in the memory array have been energized.

36. A method of refreshing memory in an electronic device, comprising:

selecting at least one memory array in the electronic device on which to perform a refresh operation;

shifting an isolation signal from an energized state to a non-energized state in the at least one memory array;

equalizing digit line pairs in the at least one memory array;

sequentially energizing wordlines in the at least one memory array to refresh memory cells connected to the energized wordline; and holding the isolation signal in a non-energized state during sequentially energizing wordlines and until an end event occurs.

37. The method according to claim 36, wherein holding the isolation signal in a non-energized state includes re-energizing the isolation signal when a self-refresh exit signal is generated.

38. The method according to claim 36, wherein holding the isolation signal in a non-energized state includes re-energizing the isolation signal when an address signal indicates that at least one of the memory cells in the memory array is to be accessed.

39. The method according to claim 38, wherein re-energizing the isolation signal includes re-energizing the isolation signal when an address signal indicates that at least one of the memory cells in the memory array is to be accessed includes reading data from the at least one memory cell.

40. The method according to claim 38, wherein re-energizing the isolation signal includes re-energizing the isolation signal when an address signal indicates that at least one of the memory cells in the memory array is to be accessed includes writing data to the at least one memory cell.

41. The method according to claim 36, wherein holding the isolation signal in a non-energized state includes re-energizing the isolation signal when a redundancy signal indicates that a memory addressing sequence jumps to another memory array.

42. The method according to claim 36, wherein holding the isolation signal in a non-energized state includes re-energizing the isolation signal when all of the wordlines in the memory array have been energized.

43. A method of refreshing memory in a circuit module, comprising:

selecting at least one memory array in at least one of a plurality of combined semiconductor dies to perform a refresh operation;

shifting an isolation signal from an energized state to a non-energized state in the at least one memory array;

equalizing digit line pairs in the at least one memory array;

sequentially energizing wordlines in the at least one memory array to refresh memory cells connected to the energized wordline; and holding the isolation signal in a non-energized state during sequentially energizing wordlines and until an end event occurs.

44. The method according to claim 43, wherein holding the isolation signal in a non-energized state includes re-energizing the isolation signal when a self-refresh exit signal is generated.

45. The method according to claim 43, wherein holding the isolation signal in a non-energized state includes re-energizing the isolation signal when an address signal indicates that at least one of the memory cells in the memory array is to be accessed.

46. The method according to claim 45, wherein re-energizing the isolation signal includes re-energizing the isolation signal when an address signal indicates that at least one of the memory cells in the memory array is to be accessed includes reading data from the at least memory cell.

47. The method according to claim 45, wherein re-energizing the isolation signal includes re-energizing the isolation signal when an address signal indicates that at least one of the memory cells in the memory array is to accessed includes writing data to the at least one memory cell.

48. The method according to claim 43, wherein holding the isolation signal in a non-energized state includes re-energizing the isolation signal when a redundancy signal indicates that a sequence in the memory device jumps to another memory array.

49. The method according to claim 43, wherein holding the isolation signal in a non-energized state includes re-energizing the isolation signal when all of the wordlines in the memory device have been energized.

50. A method of controlling an isolation gate signal during a refresh operation in a memory array, comprising:

selecting the memory array on which to perform a refresh operation;

de-energizing the isolation gate signal;

sequentially refreshing memory cells in the memory array;

holding the isolation gate signal in the de-energized state while refreshing more than one memory cell; and energizing the isolation signal when the refresh cycle end, wherein sequentially refreshing includes energizing wordlines and equalizing pairs of digit lines.

51. The method according to claim 50, wherein energizing the isolation signal when the refresh cycle ends includes energizing the isolation signal when at least one of the following occurs:

all memory cells in the memory array have been refreshed;

data from at least one of the memory cells will be read;

data will be written to at least one of the memory cells;

the sequential addressing of the memory cells jumps to another memory array; and a controller signals the refresh operation to end.

52. A memory device, comprising:

at least one memory array, the memory array requiring a refresh operation to store charges in the memory array;

at least one digit line pair connected to the at least one memory array;

first and second isolation gates connected to a first and a second of the digit line pair;

a sense amplifier connected to the isolation gate;

an isolation signal driver connected to the isolation gate, the isolation signal driver produces a non-energized isolation signal during the refresh operation such that the first and second isolation gates electrically insolate the sense amplifier from the at least one memory array for the duration of the refresh operation; and at least one equilibration circuit connected to the at least one digit line pair.

53. The memory device according to claim 52, wherein the isolation signal driver includes a latch receiving a latch reset signal and an address signal, the isolation signal driver producing a non-energized isolation signal until at least one of the latch reset signal and the address signal are on.

54. The memory device according to claim 53, wherein the latch reset signal being on indicates an end of the refresh operation in the at least one memory array.

55. The memory device according to claim 54 wherein the end of the refresh operation indicates that the refresh operation in the at least one memory array is complete.

56. The memory device according to claim 54, wherein the isolation signal driver issues a refresh exit signal after all of the wordlines have been sequentially energized.

57. The memory device according to claim 53, wherein the address signal being on indicates a memory cell in the memory array is being accessed by the input/output device.

58. A memory device, comprising:

at least one memory array;

at least one digit line pair connected to the at least one memory array;

an equalization circuit connected to the at least one digit line pair;

an isolation gate pair connected to the digit line pair;

a sense amplifier connected to the isolation gate pair; and a refresh circuit connected to the isolation gate pair and the at least one memory array, the refresh circuit having an active state and an inactive state, wherein the refresh circuit in the active state holds the isolation gate pair in a non-energized state and refreshes charges stored in the at least one memory array, in the inactive state the refresh circuit allows the isolation gate pair to fluctuate between energized and non-energized states as required to electrically connect and disconnected the digit line pair to the sense amplifier.

59. The memory device according to claim 58, wherein the refresh circuit includes a latch, the latch receiving a plurality of signals and based on a change of state of the signals re-energizes the isolation gate pair.

60. The memory device according to claim 59, wherein the plurality of signals includes a self-refresh exit signal, a memory array activation signal, a redundancy signal.

61. The memory device according to claim 58, wherein the memory array is part of a DRAM.

62. A portable electronic device comprising an input/output device, a memory array connected to the input/output device, and an energy source connected to both the input/output device and the memory array, the memory array being subject to a refresh operation and including:
   a plurality of memory cells adapted to hold charges therein representing data;
   at least two wordlines connected to the plurality of memory cells;
   at least one digit line pair connected to the memory cells;
   a equalization circuit connected to the at least one digit line pair;
   a sense amplifier;
   an isolation gate pair connecting the at least one digit line pair to the sense amplifier;
   a memory refresh circuit connected to the at least two wordlines, the memory refresh circuit sequentially energizing the at least two wordlines with energy from the energy source to refresh the charges held in the plurality of memory cells during a refresh operation; and
   an isolation gate control circuit connected to the isolation gate pair, the isolation gate control circuit producing a non-energized isolation signal opening the isolation gate pair during the refresh operation.

63. The portable electronic device according to claim 62, wherein the energy source is a portable battery.

64. The portable electronic device according to claim 63, wherein the battery is a rechargeable battery.

65. A computer system, comprising:
   a processor;
   a memory system connected to the processor, the memory system being subject to a refresh operation and including:
      at least one memory array;
      at least one digit line pair connected to the at least one memory array;
      an isolation gate pair connected to the digit line pair;
      a sense amplifier connected to the isolation gate pair; and
      a refresh circuit connected to the isolation gate pair and the at least one memory array, the refresh circuit having an active state and an inactive state, wherein the refresh circuit in the active state holds the isolation gate pair in a non-energized state and refreshes charges stored in the at least one memory array, in the inactive state the refresh circuit allows the isolation gate pair to fluctuate between energized and non-energized states as required to electrically connect and disconnected the digit line pair to the sense amplifier.

66. The computer system according to claim 65, further comprising a battery connected to both the processor and the memory device for providing energy to the processor and the memory device.

67. The computer system according to claim 65, wherein the refresh circuit includes a latch receiving an address enable signal from the processor, the address enable signal indicates that a memory cell in the memory array is being read from or written to, and the latch re-energizing the isolation gate pair upon receipt of the address enable signal.

68. An integrated circuit comprising:
   a processor; and
   a memory array, the memory array being subject to a refresh operation and including:
      a plurality of memory cells;
      at least one digit line pair connected to the plurality of memory cells;
      an equalization circuit connected to the at least one digit line pair;
      an isolation gate pair connected to the digit line pair;
      a sense amplifier connected to the isolation gate pair; and
      a refresh circuit connected to the isolation gate pair and the plurality of memory cells, the refresh circuit having an active state and an inactive state, wherein the refresh circuit in the active state holds the isolation gate pair in a non-energized state and refreshes charges stored in the plurality of memory cells, in the inactive state the refresh circuit allows the isolation gate pair to fluctuate between energized and non-energized states as required to electrically connect and disconnected the digit line pair to the sense amplifier.

69. The integrated circuit according to claim 68, wherein the processor and memory array are formed on a single substrate.

70. The integrated circuit according to claim 68, wherein both the processor and the memory array include connections to an energy source.

71. The integrated circuit according to claim 68, wherein the refresh circuit includes a latch receiving an address enable signal from the processor, the address enable signal indicates that at least one of the memory cells in the memory array is being read from or written to, and the latch re-energizing the isolation gate pair upon receipt of the address enable signal.

72. A memory device, comprising:
   a memory array divided into first and second sections, the first and second sections being subject to a refresh operation to hold the data values stored therein;
   a first pair of digit lines connected to the first section;
   a pair of first isolation gates connected to the first pair of digit lines;
   a sense amplifier connected to the first isolation gates;
   a first plurality of wordlines connected to the first section; and
   a first isolation gate controller connected to the first isolation gates, the first isolation gate controller producing a non-energized isolation signal which opens the first isolation gates during the refresh operation of the first section, the first isolation gate controller holding a first isolation signal in the non-energized state as the wordlines are successively energized during the refresh operation.

73. The memory device according to claim 72, wherein the second section is being read from or written to while the refresh operation is being performed on the first section.

74. The memory device according to claim 72, wherein the second section includes:
   a second pair of isolation gates connected to the second pair of digit lines;
   a second pair of digit lines connected to the second section, the second pair of digit lines being connected to the sense amplifier;

a second plurality of wordlines; and a second isolation gate controller connected to the second isolation gates, the second isolation gate controller producing a non-energized isolation signal which opens the second isolation gates during the refresh operation of the second section, the second isolation gate controller holding a second isolation signal in the non-energized state as the second plurality of wordlines are successively energized during the refresh operation.

75. The memory device according to claim 74, wherein the first section is being read from or written to while the refresh operation is being performed on the second section.

76. The memory device according to claim 74, wherein the second isolation gate controller includes a latch holding the second isolation signal in the non-energized state until a refresh operation end signal is received.

77. The memory device according to claim 76, wherein the refresh operation end signal includes a self-refresh exit signal, a redundancy signal, a refresh operation complete signal, and an address signal, wherein the address signal indicates that the second section is being accessed.

78. The memory device according to claim 72, wherein the first isolation gate controller includes a latch holding the first isolation signal in the non-energized state until a refresh operation end signal is received.

79. The memory device according to claim 78, wherein the refresh operation end signal includes a self-refresh exit signal, a redundancy signal, a refresh operation complete signal, and an address signal, wherein the address signal indicates that the second section is being accessed.

80. A refresh control circuit, comprising:

at least one input adapted to receive refresh operation end signals, wherein the at least one input includes a redundancy signal; and an output connected to an isolation gate in a memory device, wherein the output holds the isolation gate in a de-energized state during a refresh operation.

81. The refresh control circuit according to claim 80, wherein the at least one input includes a self refresh end signal.

82. The refresh control circuit according to claim 80, wherein the at least one input includes an address enable signal.

83. The refresh control circuit according to claim 80, wherein the at least one input includes an enable signal.

84. The refresh control circuit according to claim 80, wherein the at least one input includes a self refresh complete signal.

85. An isolation signal control circuit for holding an isolation signal in a de-energized state during a refresh operation of memory cells associated with at least two wordlines, comprising:

at least one input adapted to receive refresh end signals and a redundancy signal; and an output connected to an isolation signal line, wherein the output is de-energized during energization of at least two wordlines during the refresh operation and until an end signal is received.

* * * * *